(12) United States Patent
Hwang (10) Patent No.: US 8,274,102 B2
(45) Date of Patent: *Sep. 25, 2012

(54) SEMICONDUCTOR DEVICE

(75) Inventor: Yun Taek Hwang, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/893,877

(22) Filed: Sep. 29, 2010

(65) Prior Publication Data

US 2011/0012207 A1    Jan. 20, 2011

Related U.S. Application Data

(62) Division of application No. 12/134,280, filed on Jun. 6, 2008, now Pat. No. 7,824,971.

(30) Foreign Application Priority Data

Feb. 29, 2008    (KR) .................. 10-2008-0018877

(51) Int. Cl.
*H01L 29/772* (2006.01)

(52) U.S. Cl. ............... 257/288; 257/369; 257/E21.614

(58) Field of Classification Search .......... 257/288, 257/382, 369, 758, 285, E21.614; 438/152–153
See application file for complete search history.

(56) References Cited

U.S. PATENT DOCUMENTS

| 5,470,776 | A | 11/1995 | Ryou |
|---|---|---|---|
| 6,365,943 | B1 | 4/2002 | Gardner et al. |
| 2004/0065884 | A1 | 4/2004 | Bhattacharyya |
| 2004/0178406 | A1 | 9/2004 | Chu |
| 2007/0181953 | A1 | 8/2007 | Lyu et al. |
| 2008/0251819 | A1 * | 10/2008 | Taketani .................... 257/288 |
| 2008/0251856 | A1 | 10/2008 | Zhu et al. |
| 2009/0032851 | A1 * | 2/2009 | Pfirsch et al. ............. 257/288 |
| 2009/0146246 | A1 | 6/2009 | Hwang et al. |
| 2009/0218628 | A1 | 9/2009 | Hwang |
| 2009/0218635 | A1 | 9/2009 | Hwang |

FOREIGN PATENT DOCUMENTS

| KR | 10-2006-0135124 | 12/2006 |
|---|---|---|
| WO | 2007/018495 | 2/2007 |

OTHER PUBLICATIONS

Notice of Rejection for Korean Patent Application No. 10-2008-0018877, dated Jun. 30, 2009.

* cited by examiner

*Primary Examiner* — Nathan Ha (74) *Attorney, Agent, or Firm* — Marshall, Gerstein & Borun LLP (57) ABSTRACT

A semiconductor device includes a PMOS transistor of a peripheral circuit region. The PMOS transistor is formed over a silicon germanium layer to have a compressive strain structure, thereby increasing hole mobility of a channel region in operation of the device. The semiconductor device may include a second active region including a silicon layer connected to a first active region of a semiconductor substrate, a silicon germanium layer formed over the silicon layer expected to be a PMOS region, and a PMOS gate formed over the silicon germanium layer.

12 Claims, 8 Drawing Sheets

Fig.8

SEMICONDUCTOR DEVICE

CROSS-REFERENCE TO RELATED APPLICATION

This is a divisional of U.S. application Ser. No. 12/134,280 filed Jun. 6, 2008, which claims the priority benefit under 35 USC §119 of Korean patent application number 10-2008-0018877, filed on Feb. 29, 2008, the disclosures of each of the foregoing applications being hereby incorporated by reference herein in its entirety.

BACKGROUND OF THE INVENTION

The present invention relates to a semiconductor device and a method for manufacturing a semiconductor device, and more specifically, to a technology of forming a transistor having a stacked structure in a peripheral circuit region and forming a PMOS transistor of an upper layer over a silicon germanium layer to have a compressive strain structure, thereby increasing hole mobility of a channel region in operation of the device.

Due to high integration of semiconductor devices, an area occupied by a device has been reduced. As a result, a transistor size becomes smaller, a space between a source region and a drain region becomes narrower, and a channel length becomes shorter. Also, a size of a contact plug that contacts with the source/drain region of the transistor is reduced.

When the size of the contact plug is reduced, a contact resistance (Rc) between a silicon substrate and the contact plug is increased. As a result, a current characteristic of the device is degraded obstructing high speed operation of the device.

SUMMARY OF THE INVENTION

Various embodiments of the present invention are directed at providing a method for manufacturing a semiconductor device that comprises forming a PMOS transistor of a peripheral circuit region over a silicon germanium layer to have a compressive strain structure, thereby increasing hole mobility of a channel region in operation of the device.

Various embodiments of the present invention are directed at providing a semiconductor device including a transistor having a stacked structure in a peripheral circuit region to increase net die.

According to an embodiment of the present invention, a semiconductor device may include: a first active region formed in a semiconductor substrate; a second active region located over the first active region, wherein the second active region is connected to the first active region; a silicon germanium layer formed in a PMOS region of the second active region; and a gate formed on the silicon germanium layer. The second active region includes a silicon layer. The semiconductor device may further include an intervening layer between the first active region and the second active region. A mole ratio of germanium in the silicon germanium layer is 0.05 to 0.35.

According to an embodiment of the present invention, a method for manufacturing a semiconductor device may include: forming a first active region in a semiconductor substrate; forming a second active region over the first active region to connected the first active region to the second active region; forming a silicon germanium layer in a PMOS region of the second active region; and forming a gate on the silicon germanium layer.

The forming a second active region may include: forming an insulating film on the first active region; forming a contact hole exposing the first active region by penetrating the insulating film; and forming a silicon layer in the contact hole and on the insulating film. The silicon layer is formed with a thickness in a range of 500 Å to 20000 Å from a surface of the insulating film. The silicon layer may be formed by a selective epitaxial growth.

The forming a silicon germanium layer may include: forming a hard mask pattern exposing the PMOS region on the silicon layer; forming a trench in the second active region by using the hard mask pattern as an etch mask; growing a silicon germanium layer in the trench; and removing the hard mask pattern and planarizing the silicon germanium layer. The trench has a depth ranging from 300 Å to 10000 Å. The silicon germanium layer is formed by a selective epitaxial growth. The silicon germanium layer has a thickness ranging from 500 Å to 5000 Å. A mole ratio of germanium in the silicon germanium layer is 0.05 to 0.35.

DETAILED DESCRIPTION OF THE SPECIFIC EMBODIMENT

FIGS. 1 to 8 are cross-sectional diagrams illustrating a method for manufacturing a semiconductor device according to an embodiment of the present invention.

Figure 1:
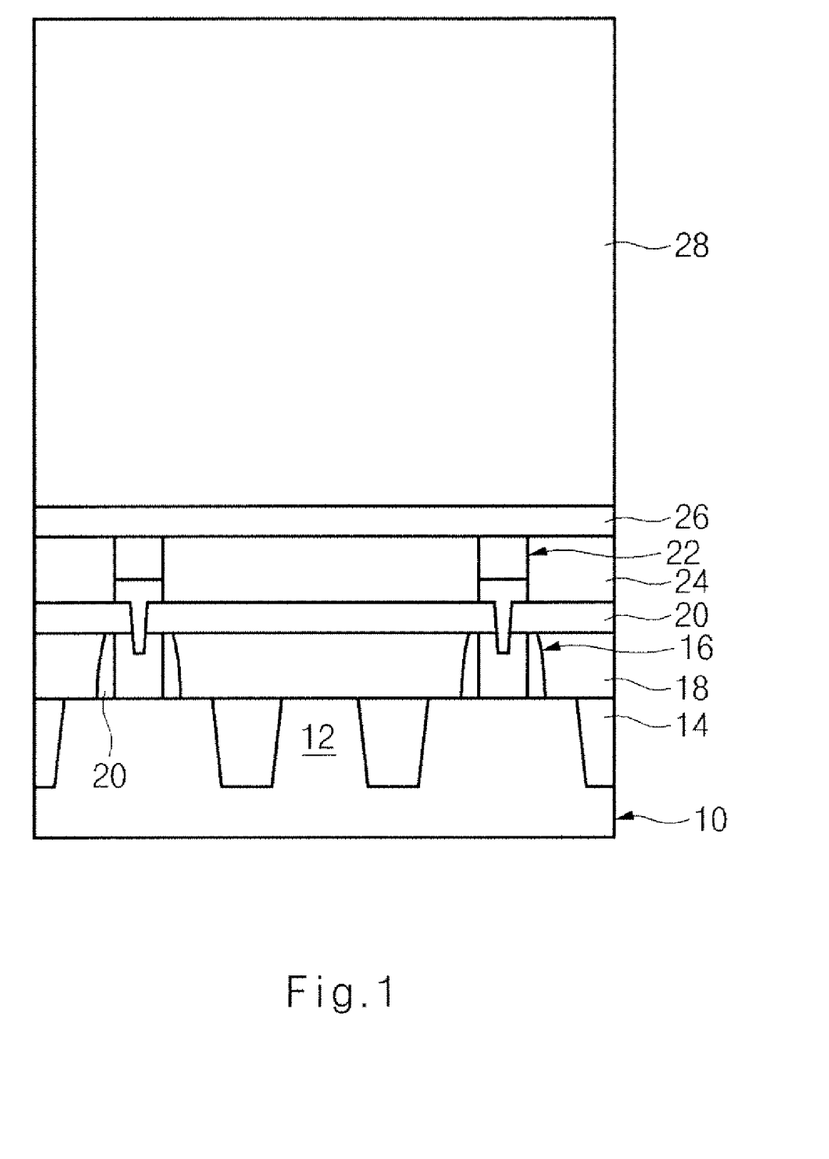
FIGS. 1 to 8 are cross-sectional diagrams illustrating a method for manufacturing a semiconductor device according to an embodiment of the present invention.

Referring to FIG. 1, a first device isolating film 14 that defines a first active region 12 is formed in a peripheral circuit region of a semiconductor substrate 10. The first device isolating film 14 is formed by a shallow trench isolation (STI) process.

A first gate 16 is formed over the first active region 12. A first interlayer insulating film 18 is formed over the semiconductor substrate 10 to fill a gap between the first gate 16.

A second interlayer insulating film 20 is formed over the first interlayer insulating film 18 including the first gate 16. The second interlayer insulating film 20 is selectively etched to form a bit line contact hole (not shown) that exposes the first gate 16.

A conductive layer (not shown) is formed over the second interlayer insulating film 20 including the bit line contact hole. The conductive layer is etched by a photo-etching process with a bit line mask (not shown) to form a bit line 22.

A third interlayer insulating film 24 is formed over the second interlayer insulating film 20 to fill a space between the bit line 22. An etching barrier film 26 is formed over the bit line 22 and the third interlayer insulating film 24.

A fourth interlayer insulating film 28 is formed over the etching barrier film 26. The fourth interlayer insulating film 28 is formed to have a thickness ranging from about 5000 Å to about 20000 Å.

Figure 2:
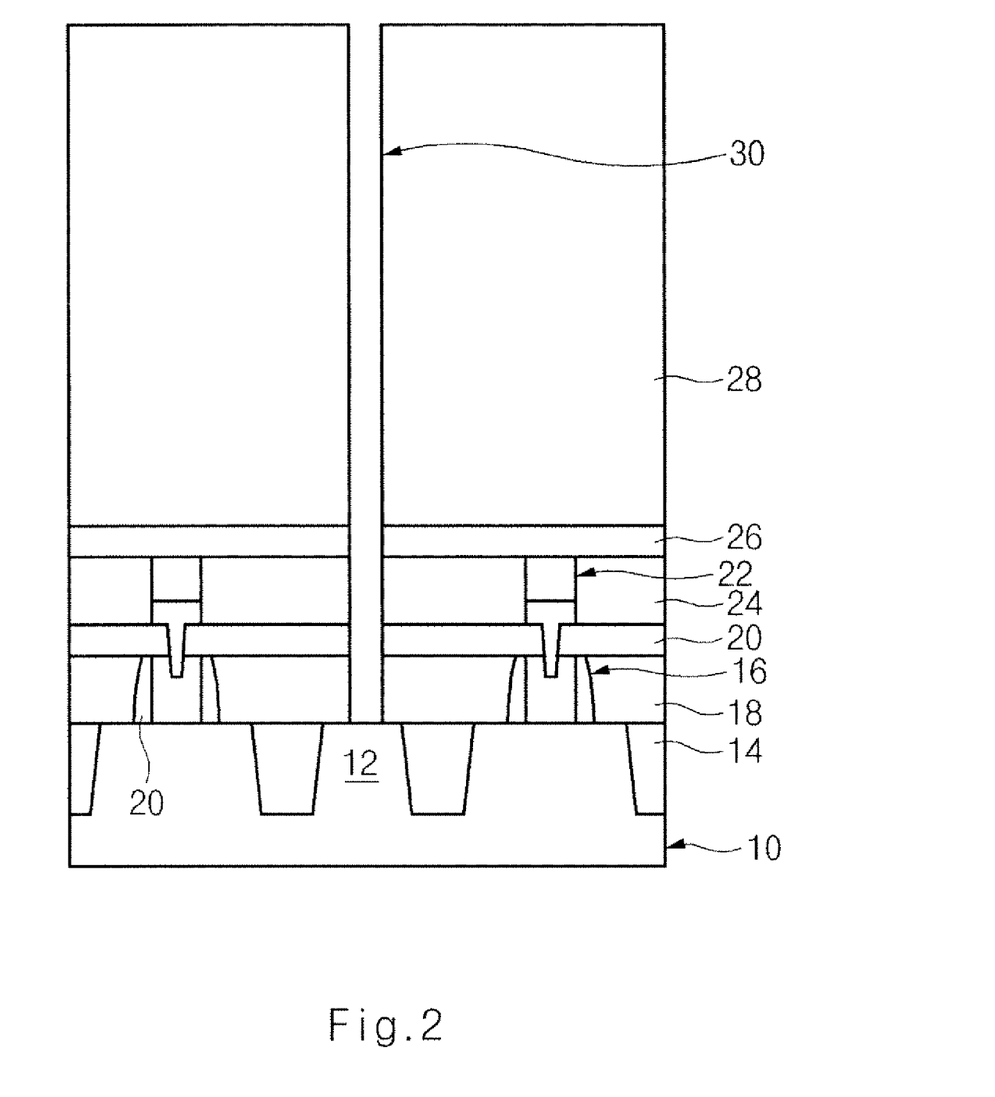

Referring to FIG. 2, the fourth interlayer insulating 28, the etching barrier film 26, the third interlayer insulating film 24, the second interlayer insulating film 20 and the first interlayer insulating film 18 which are formed between the first gates 16 are selectively etched to form a contact hole 30 that exposes the active region 12.

Figure 3:
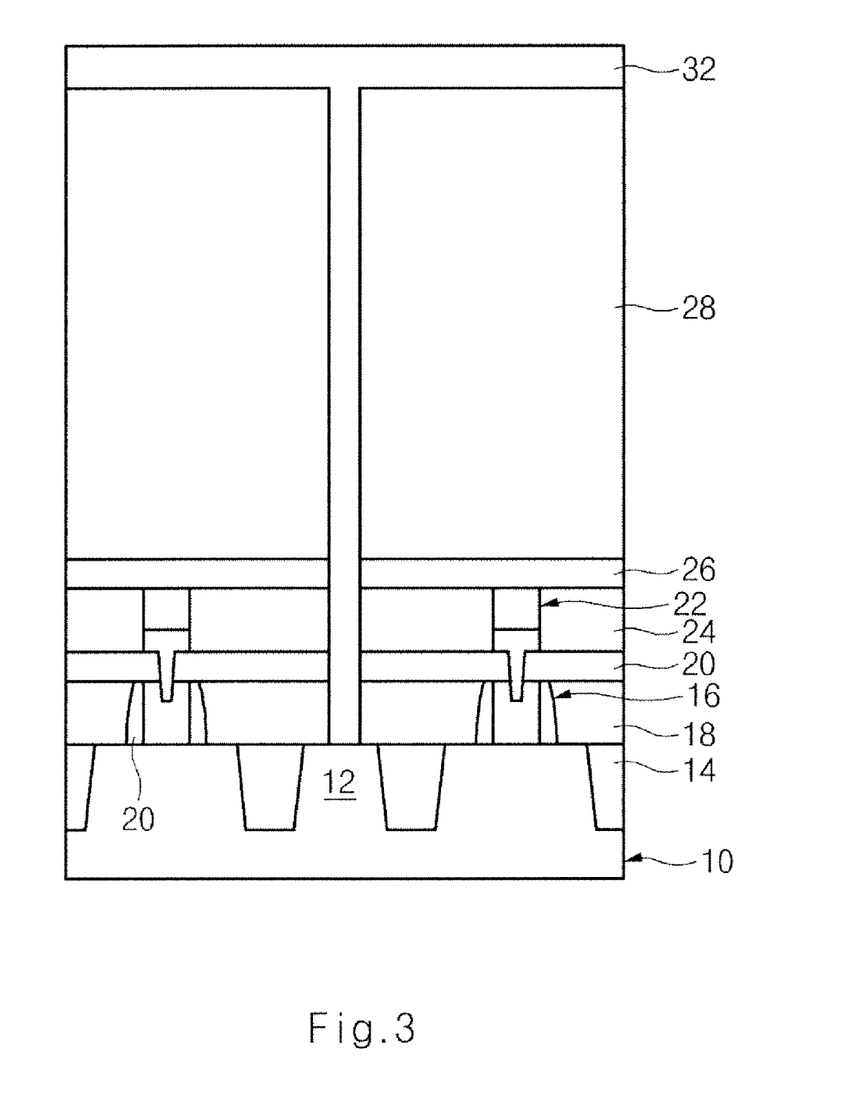

Referring to FIG. 3, a second semiconductor substrate 32 is formed over the fourth interlayer insulating film 28 to fill the contact hole 30 by a selective epitaxial growth (SEG) process with the first active region 12 located in the bottom of the contact hole 30 as a seed layer. Herein, the second semiconductor substrate 22 can be formed by two step process. The second semiconductor substrate 22 is grown to fill a part of the contact hole 30, and re-grown to fill fully the contact hole 30. The second semiconductor substrate 32 is planarized.

The second semiconductor substrate 32 is formed with a thickness range of about 500 Å to about 20000 Å from a surface of the fourth interlayer insulating film 28. The second semiconductor substrate 32 is planarized by one selected from the group consisting of a chemical mechanical polishing (CMP) process, an etch-back process and combinations thereof.

Figure 4:
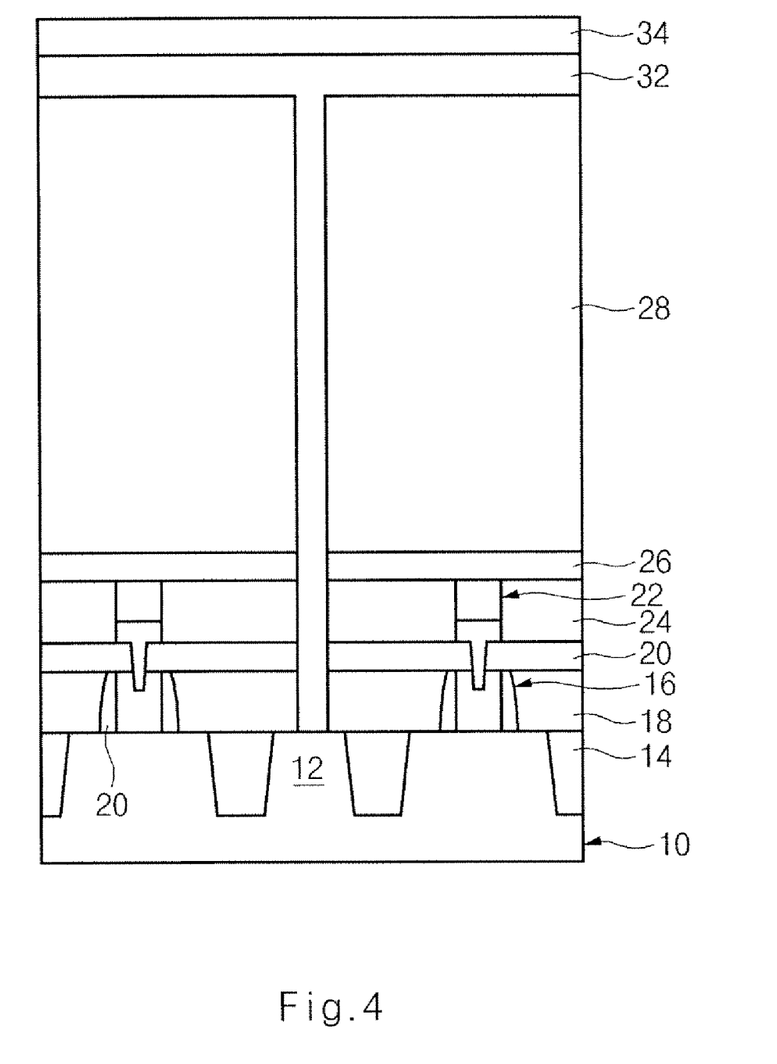

Referring to FIG. 4, a hard mask layer 34 is formed over the second semiconductor substrate 32. The hard mask layer 34 includes an oxide film to have a thickness ranging from about 100 Å to about 3000 Å.

Figure 5:
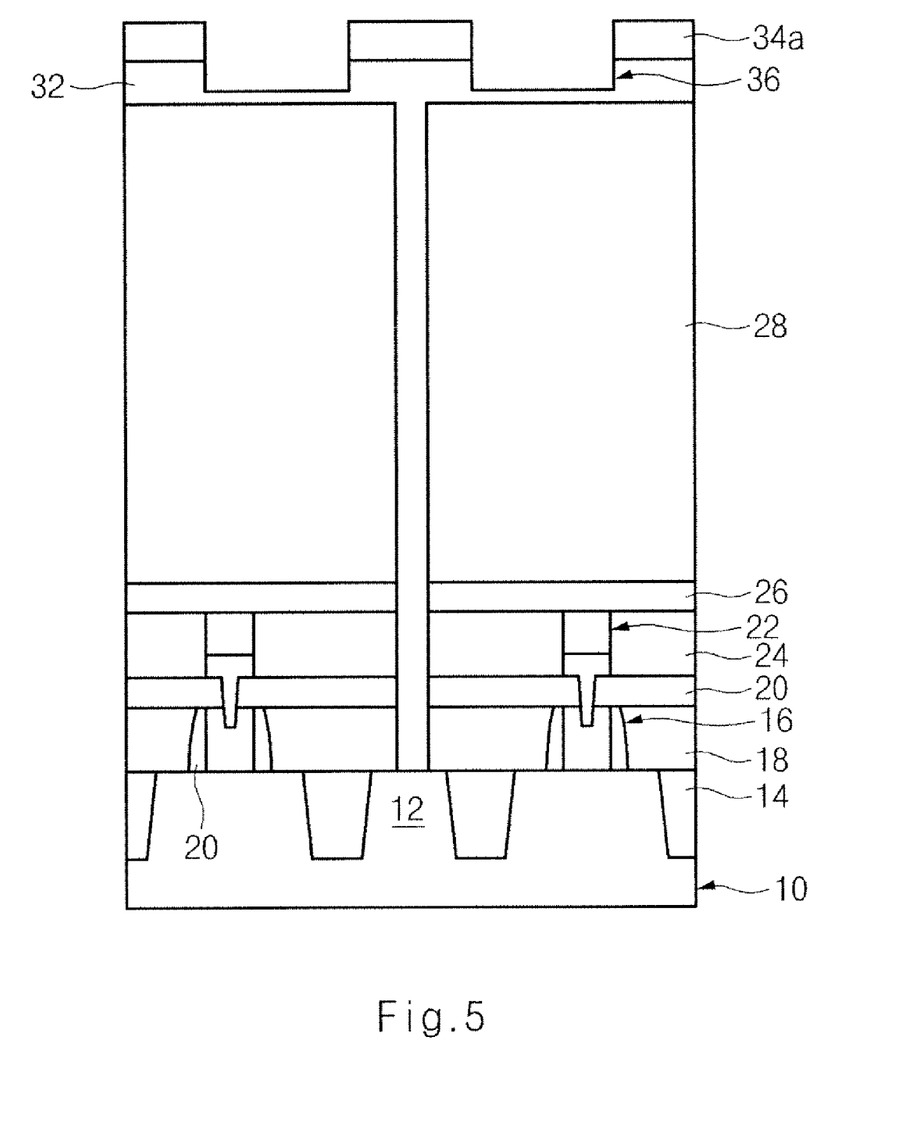

Referring to FIG. 5, the hard mask layer 34 of a PMOS region is removed to form a hard mask pattern 34a. The hard mask layer 34 is removed by a plasma etching process.

The second semiconductor substrate 32 is etched with the hard mask pattern 34a as an etching mask to form a trench 36. The trench 36 is formed to have a depth ranging from about 300 Å to about 10000 Å.

Figure 6:
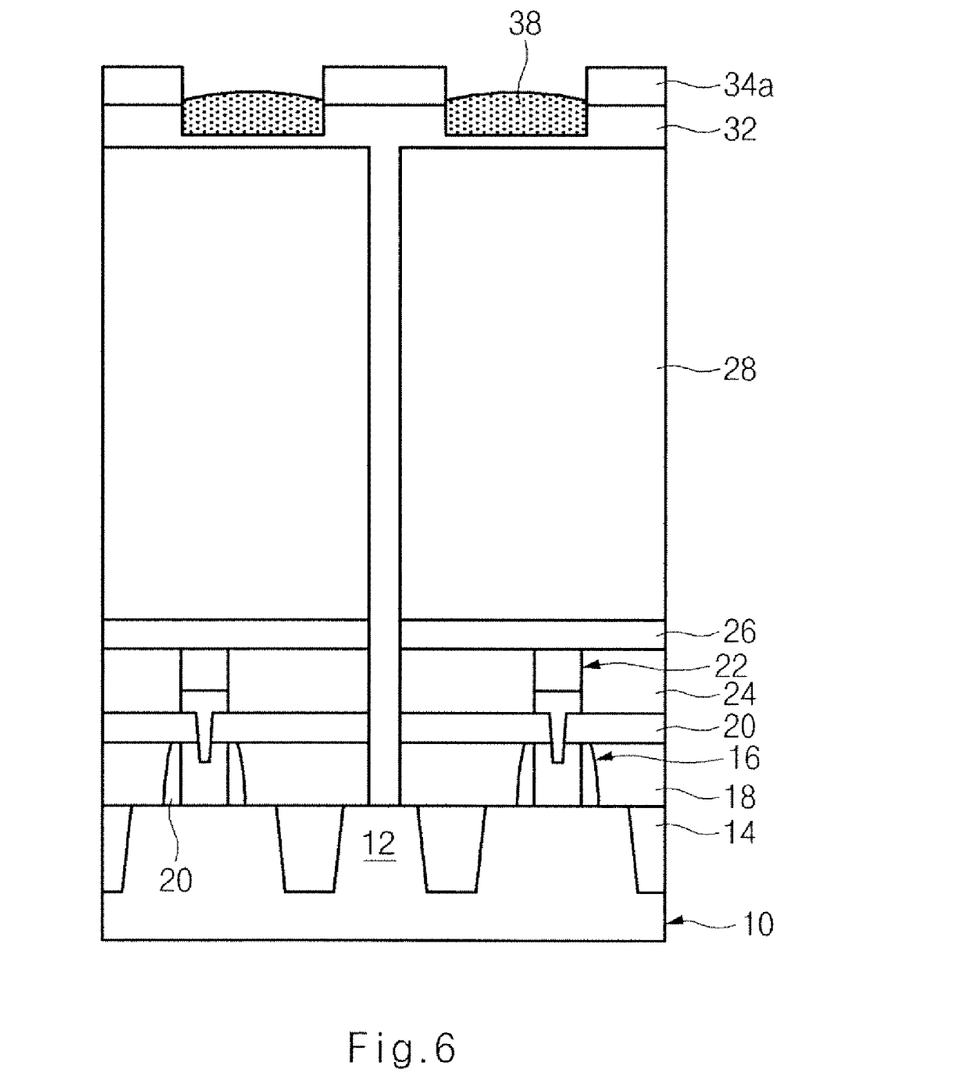

Referring to FIG. 6, a silicon germanium (Si1-xGex) layer 38 (x is an actual number, $0.05 \leq x \leq 0.35$) is formed in the trench 36 by a SEG process with the second semiconductor substrate 32 exposed by the trench 36 as a seed layer. The Si1-xGex layer 38 has a thickness ranging from about 500 Å to about 5000 Å. A mole ratio of germanium in the silicon germanium layer is about 0.05 to about 0.35.

Figure 7:
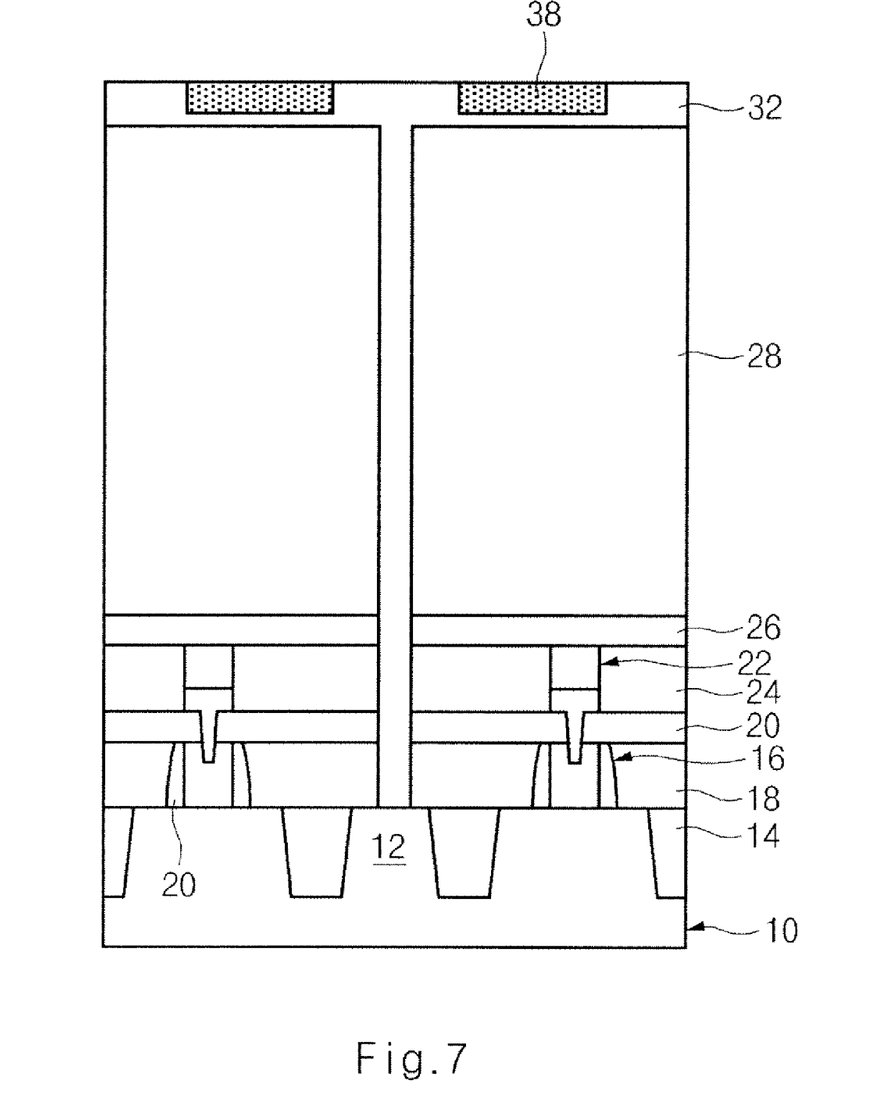

Referring to FIG. 7, the hard mask pattern 34a is removed. The Si1-xGex layer 38 is planarized by one selected from the group consisting of a chemical mechanical polishing (CMP) process, an etch-back process and combinations thereof.

Figure 8:
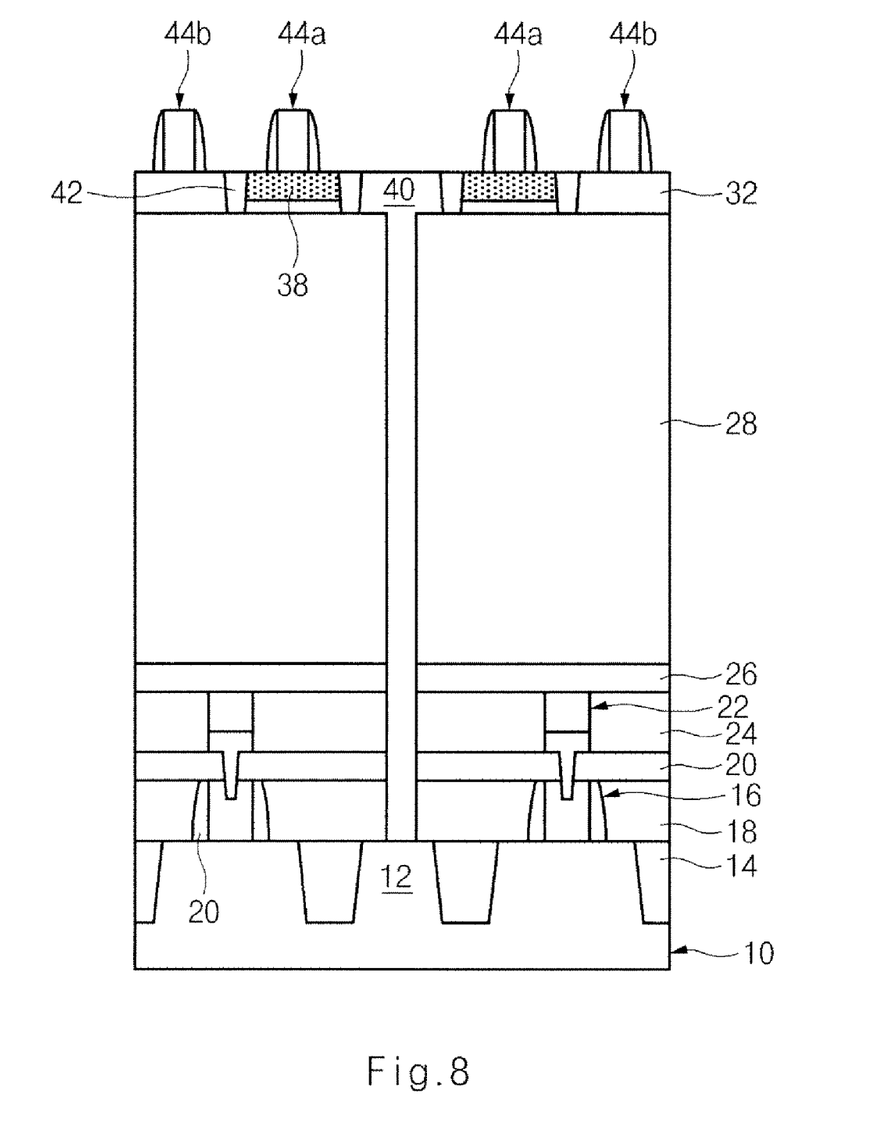

Referring to FIG. 8, a second device isolating film 42 that defines a second active region 40 is formed in the second semiconductor substrate 32. The second device isolating film 42 is formed by a STI process. A gate 44a of a PMOS transistor is formed over the Si1-xGex layer 38, and a gate 44b of a NMOS transistor is formed over the second active region 34.

As described above, according to an embodiment of the present invention, a method for manufacturing a semiconductor device may include forming a PMOS transistor of a peripheral circuit region over a silicon germanium layer to have a compressive strain structure, thereby increasing hole mobility of a channel region in operation of the device. The semiconductor device may include a transistor having a stacked structure in a peripheral circuit region to increase net die.

The above embodiments of the present invention are illustrative and not limitative. Various alternatives and equivalents are possible. The invention is not limited by the lithography steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
   a first active region formed in a semiconductor substrate;
   a second active region located over the first active region, wherein the second active region is coupled to the first active region;
   a silicon germanium layer formed in a PMOS region of the second active region;
   a PMOS gate formed over the silicon germanium layer formed in the PMOS region of the second active region; and
   an NMOS gate formed over the second active region.

2. The semiconductor device according to claim 1, wherein the second active region includes a silicon layer.

3. The semiconductor device according to claim 1, further comprising an intervening layer between the first active region and the second active region.

4. The semiconductor device according to claim 1, wherein a mole ratio of germanium in the silicon germanium layer is 0.05 to 0.35.

5. The semiconductor device according to claim 1, further comprising:
   an insulating film formed over the first active region;
   a contact hole which exposes the first active region and penetrates the insulating film; and
   a silicon layer formed in the contact hole and on the insulating film.

6. The semiconductor device according to claim 5, wherein the silicon layer is a selective epitaxial growth layer.

7. The semiconductor device according to claim 5, wherein the silicon layer has a thickness in a range of 500 Å to 20000 Å from a surface of the insulating film.

8. The semiconductor device according to claim 1, wherein the silicon germanium layer has a thickness ranging from 500 Å to 5000 Å.

9. A semiconductor device comprising:
   an active region formed in a semiconductor substrate;
   a silicon germanium layer formed in a PMOS region of the active region;
   a PMOS gate formed over the silicon germanium layer formed in a PMOS region of the active region; and
   an NMOS gate formed over the active region.

10. The semiconductor device according to claim 9, wherein the active region includes a silicon layer.

11. The semiconductor device according to claim 9, wherein a mole ratio of germanium in the silicon germanium layer is 0.05 to 0.35.

12. The semiconductor device according to claim 9, wherein the silicon germanium layer has a thickness ranging from 500 Å to 5000 Å.

* * * * *